(12) United States Patent  
Zhou

(10) Patent No.: US 7,327,202 B2  
(45) Date of Patent: Feb. 5, 2008

(54) OPTIMIZATION FOR AN IQ MODULATOR

(75) Inventor: Zhengrong Zhou, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 111 days.

(21) Appl. No.: 11/444,743

(22) Filed: May 31, 2006

(65) Prior Publication Data

US 2007/0279144 A1    Dec. 6, 2007

(51) Int. Cl.
*H03C 3/00* (2006.01)
(52) U.S. Cl. ............... 332/103; 332/105; 332/107; 332/151; 332/159; 375/295; 375/298
(58) Field of Classification Search ............ 332/103, 332/105, 107, 151, 159; 375/295, 298
See application file for complete search history.

(56) References Cited

U.S. PATENT DOCUMENTS 5,663,691 A * 9/1997 Kowalik et al. ............ 332/103

6,798,844 B2 * 9/2004 Ratto ...................... 375/296

* cited by examiner

Primary Examiner—Arnold Kinkead
(74) Attorney, Agent, or Firm—Marc Bobys

(57) ABSTRACT

An IQ modulator's performance is optimized through determination of suitable control parameters by the application of known DC biases as the I and Q inputs. Also known are the relative amplitude and actual phase of the sine and cosine carriers to be modulated before they are summed. It is shown that by measuring an RMS voltage $A_{total}$ an appropriate number of times for a related combination of the applied DC biases in conjunction with the other known input parameters, a number of behavior parameters that are indicative of mixer performance can be discovered through analysis, such as the solution of a system of linear equations. The combination of behavior parameters may be assigned a Figure Of Merit (FOM) that can be taken as an indication of the degree to which mixer operation approaches ideal behavior. The control parameters may be perturbed over a selected range, and the extraction of the behavior parameters repeated. The combination of control parameters that produces the best FOM is taken as the optimum operating point for the mixer.

2 Claims, 3 Drawing Sheets

FINDING BEHAVIOR PARAMETERS

FINDING OPTIMUM CONTROL PARAMETERS

OPTIMIZATION FOR AN IQ MODULATOR

INTRODUCTION AND BACKGROUND

IQ modulation is a very general form of modulation that allows independent influence of both the amplitude and phase of the carrier signal being modulated. Although IQ modulators can be used in a truly continuous analog manner, they are widely used in modulating carrier signals with program material that is either in a digital format to begin with, or that has been digitized prior to modulation. In digital modulation various combinations of carrier amplitude and phase are assigned respective digital values. For example, if eight amplitudes were allowed, and eight phases, the transmitted carrier would have a repertoire of sixty-four 'modulation symbols' that would be placed into correspondence with, say, sixty-four different six-bit integers. This is a process of encoding, particularly if the mapping is not static and not altogether obvious (of which complexity there are well known standard techniques). Program material to be modulated in this manner is rendered into a stream of bits, grouped into six-bit bytes, and those bytes are applied to the encoder/modulator at some convenient rate. The actual I and Q input signals to the modulator are frequently filtered to limit their slewing rate as they go from one value to the next, the better to keep spurious sidebands from being objectionable. At the receiving end a demodulator/decoder recognizes (according to the mapping) the different combinations of amplitude and phase as the same modulation symbols, and re-produces a sequence of the corresponding (original) bytes, which are then reassembled back into the original bit stream of digital program material. In many applications, the recovered bits are then appropriately framed into words and applied to an ADC (Analog to Digital Converter) to reproduce analog program material for human consumption (e.g., a voice channel for a cellular telephone).

Fidelity in this process depends upon, among other things, that the IQ modulator accurately produces the various modulation symbols (combinations of carrier amplitude and phase). In a truly digital setting or application there is little or no restriction on what modulation symbol can follow another (just as there is no restriction on what bit can follow another in an arbitrary bit stream), so there is little or nothing that the demodulator per se can do to detect errors. True, there are systems that use training sequences to characterize a channel, and such things as error correcting codes for expressing the program material. These, however, are levels of abstraction and control that are wrapped around, or built on top of, the IQ modulation scheme. The I/Q modulator/demodulator pair must deal with those 'special' bits, just as it would with any 'ordinary' bits. The first line of defense for system integrity is the accurate production of the correct IQ modulation symbols, as close to their intended parametric values as possible (i.e., on frequency, with the correct amplitude and the correct phase). It is in this way that the demodulator/decoder has the best chance of sending/reproducing the original program material.

Each IQ modulator has a collection of one or more operational control parameters that can be adjusted over associated ranges, and whose combination of values (if there should be more than one control parameter) produces modulator operation that approaches the ideal in greater or lesser degrees.

It turns out that, especially when used at VHF (Very High Frequencies) and above, say above 100 MHz, that two IQ modulators that are ostensibly identical assemblies will produce slightly different parametric values for their modulation symbols. Exact measurement of this is a difficult task for general purpose test equipment, such as counters and spectrum analyzers, and the better instances of such general purpose test equipment that have the required speed and resolution are fairly expensive. They can sometimes be fussy to set up and make measurements with confidence, particularly for operators who are less familiar with their operation. Special purpose modulation analyzers are available whose measurement capabilities are deliberately tailored for, and thus more suited to, IQ modulation of the various popular flavors, but they are not inexpensive, either! Furthermore, while either of those measurement strategies will distinguish between 'generally good' and 'truly bad' behavior, it is not clear that either can be easily used to assist in finding or recognizing operating points for the applied control parameters that result in 'improved' behavior.

To improve the fidelity and reliability of an overall IQ modulation system it would be desirable if there were a cost effective way of characterizing a particular instance of an IQ modulator so as to optimize its actual behavior by having it produce the best possible approximation of ideal behavior. This is particularly so if the modulator is part of an integrated circuit assembly that is otherwise to be tested on automated IC tester that does not normally include the measurement repertoire of a genuine modulation analyzer.

Simplified Description

A solution to the problem of optimizing the behavior of an IQ modulator at a work carrier frequency by selecting optimum values for its control parameters begins with the application of known DC biases as the I and Q inputs. Also known as input parameters are the relative amplitude of the two carriers (one sine, one cosine) to be modulated before they are summed, and the actual phase between those two carriers. It is shown that by measuring an RMS voltage $A_{total}$ an appropriate number of times for a related combination of the applied DC biases in conjunction with the other known input parameters, a number of behavior (output) parameters that are indicative of mixer performance can be discovered through analysis, such as the solution of a system of linear equations. The combination of behavior parameters can, if desired, be assigned a Figure Of Merit (FOM) that can be taken as an indication of the degree to which mixer operation approaches ideal behavior. Then the control parameters are perturbed, say, one at a time over a selected range, and the extraction of the behavior parameters is repeated for each perturbation. The control parameter, or combination thereof, that produces the best FOM are taken as the best (optimum) operating point for the mixer. The behavior parameters can be 'errors' of essentially the same weight, in which case a suitable FOM is simply the summation of those errors, with lower summations being a better FOM.

DETAILED DESCRIPTION

Case I—An Ideal IQ Modulator

Figure 1:
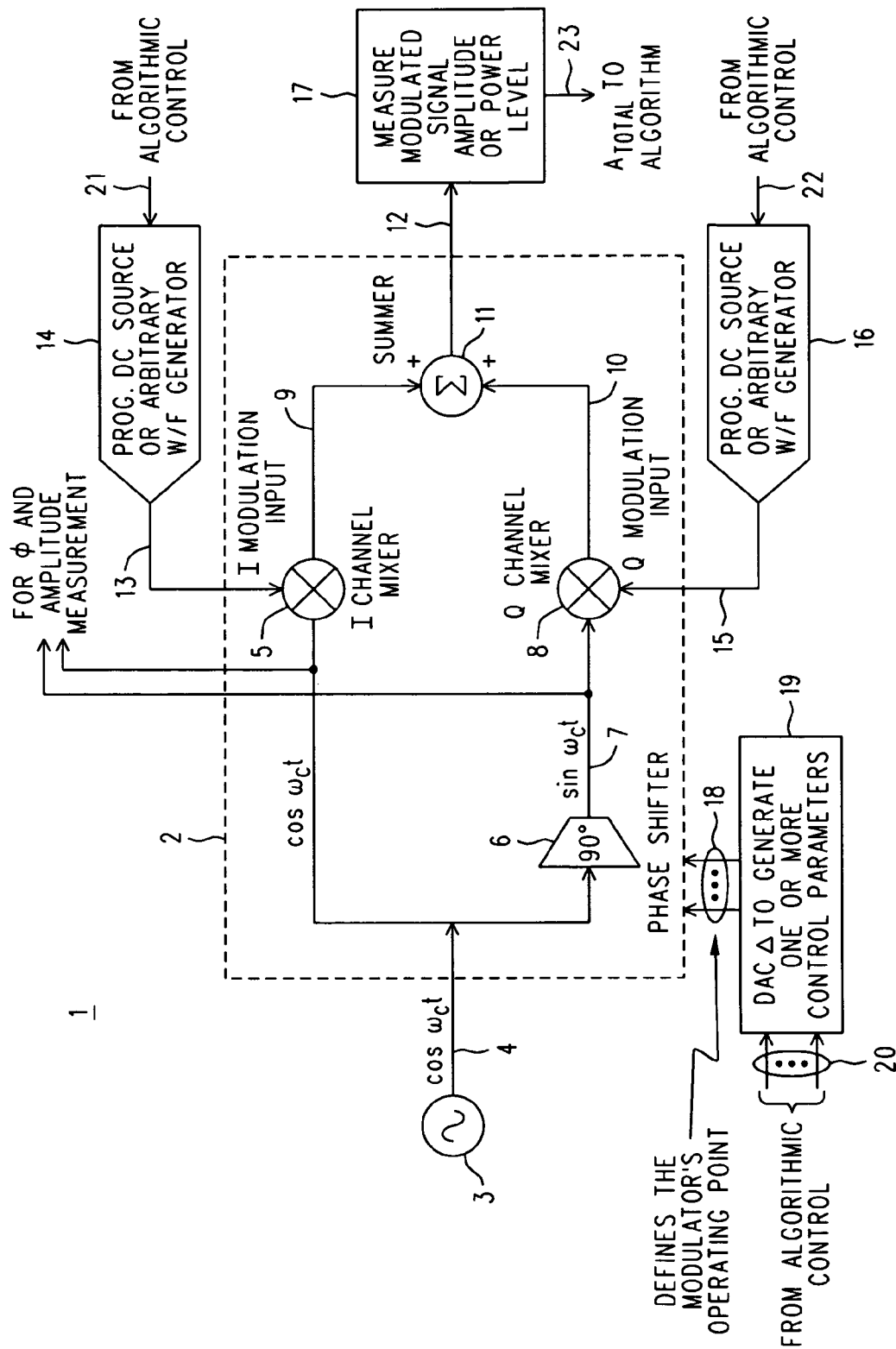
FIG. 1 is a simplified block diagram of a mixer to which the optimization technique described herein can be applied.

Refer now to FIG. 1, wherein is shown a simplified block diagram 1 for finding optimal values for one or more control parameters (18) by adjusting the DC bias levels (13, 15) applied to an IQ modulator 2 whose performance is to be optimized. For the sake of explanation, assume that the components shown therein are ideal.

Insofar as it is an IQ modulator, the modulator (2) itself is conventional, but it will be noted that we have shown it in a setting 1 that includes algorithmic control and the ability to set as DC bias levels the I and Q inputs. The arrangement 1 includes a CW (Continuous Wave) source, or oscillator, 3 whose output 4 is the carrier signal (cos) to be modulated. Signal 4 is applied to an I channel mixer 5, which may be a double balanced mixer, and also to a 90° phase shifter 6. The output 7 of the phase shifter (sin) is applied to another mixer 8 that is the Q channel mixer.

A variable DC bias signal 13 produced by a programmable DC source or arbitrary waveform generator 14 under algorithmic control (21) is applied as an I modulation input to the I channel mixer 5. Similarly, a variable DC bias signal 15 produced by a programmable DC source or arbitrary waveform generator 16 under algorithmic control (22) is applied as a Q modulation input to the Q channel mixer 8.

The outputs 9 and 10 from mixer 5 and 8, respectively, are summed by summer 11 to form an IQ modulated signal 12 whose amplitude or power level ($A_{total}$, 23) is measured by suitable test equipment 17 (e.g., broadband RF voltmeter or a power meter). The measured $A_{total}$ (23) is supplied to the mechanism (not shown—but it is a computer running a suitable program, and interfaced to elements 14, 16, 17 and 19) performing the optimization algorithm to be described.

Note that the phase between the cos and sin signals (4 and 7) and their amplitude (individual or relative) are made available for measurement. These measurements are made in a conventional manner, and the results made available as input parameters to the algorithmic mechanism.

Finally, it will be appreciated that IQ modulators are susceptible of 'tweaking' according to one or more applied control parameters (18). Examples include slight adjustments to the phase shifter 6 and the relative amplitude of the sin and cos signals. There might also be 'local' biases applied to the individual mixers (5 and 8). These things would depend upon the exact nature of the particular IQ modulator 2 at hand. So, there might be just one control parameter 18, or a collection. In any event, as far as we are concerned, there are just a collection of one or more control parameters, and if more than one, each different combination of values is a different 'value' (or state) of the one or more control parameters, and we won't delve into how the algorithmic mechanism might increment or decrement the individual components of the combination.

That said, note that there are (one or more) DACs 19 that, in response to signals 20 from the algorithmic control mechanism, provide the one or more control parameters (18). We shall find an optimum value(s) of the control parameters 18 by monitoring changes in the behavior parameters as the control parameters are varied, as if by trial and error. However, we shall not measure the behavior parameters directly. We shall find them indirectly, through inexpensive means, and it is to that, toward which we now turn our attention.

Ideally, we have two carrier CW (Continuous Wave) signals, one for the I-channel and one for the Q-channel, each with carrier frequency $\omega_c$, and that are 90° out of phase. Then the output of the modulator would be:

$$\Psi = I \times \cos(\omega_c t) + Q \times \sin(\omega_c t) \qquad (\text{Eq. 1})$$

If the I modulation input signal I and Q modulation input signal Q are two identical DC voltages V:

$$I = Q = V$$

The modulator's output will then be:

$$\Psi = V \times [\cos(\omega_c t) + \sin(\omega_c t)] = \sqrt{2}\, V \times \cos\left(\omega_c t - \frac{\pi}{4}\right) \qquad (\text{Eq. 2})$$

On the other hand, if I and Q are also two CW signals that are 90° out of phase:

$$I = A\cos(\omega t) \text{ and } Q = A\sin(\omega t)$$

Then we will have as the output:

$$\Psi = A[\cos(\omega t) \times \cos(\omega_c t) + \sin(\omega t) \times \sin(\omega_c t)] = A\cos[(\omega_c - \omega)t] \qquad (\text{Eq. 3})$$

This result is still a CW signal, but has a shifted frequency of $\omega_c - \omega$.

Case II—A Non-Ideal IQ Modulator

In this non-ideal model, we assume that the two CW sine and cosine carrier signals are phase impaired, that the I and Q channel have amplitude errors, that their phase error can be neglected, and also that the I and Q channels also impose DC offset errors. Then the output signal would be:

$$\Psi = (I \times d_I + \delta_I)\cos(\omega_c t + \phi_c) + (Q \times d_Q + \delta_Q)\sin(\omega_c t + \phi_c + \phi) \qquad (\text{Eq. 4})$$

$\phi_c$ is the initial phase of the carrier, $d_I$ and $d_Q$ the amplitude error factors, $\delta_I$ and $\delta_Q$ the DC offset errors, and $\phi$ the phase imbalance error for the non-ideal IQ modulator.

Now the task is to find a way to measure the amplitude errors, the DC offsets and the phase imbalance, and then to adjust the control parameters (e.g. the control DACs 19) of the IQ modulator 2 such that ideally we can finally make $d_I = d_Q$, $\delta_I = 0$, $\delta_Q = 0$ and $\phi = 0$. In reality the best we can achieve might be $d_I \approx d_Q$, $\delta_I \approx 0$, $\delta_Q \approx 0$ and $\phi \approx 0$.

Case III—An Algorithm to Measure Actual IQ Modulator Behavior

Suppose we apply known DC levels (biases) to the IQ modulator with $I = V_I$ and $Q = V_Q$.

The output from the modulator would be:

$$\Psi = (V_I \times d_I + \delta_I)\cos(\omega_c t + \phi_c) + (V_Q \times d_Q + \delta_Q)\sin(\omega_c t + \phi_c + \phi) \qquad (\text{Eq. 5})$$

which, by going through some basic trigonometric transforms, can be rearranged as $$\Psi = [(V_I d_I + \delta_I)\cos(\phi_c) + (V_Q d_Q + \delta_Q)\sin(\phi_c + \phi)] \times \cos(\omega_c t) - [(V_I d_I + \delta_I)\sin(\phi_c) - (V_Q d_Q + \delta_Q)\cos(\phi_c + \phi)] \times \sin(\omega_c t)$$

and finally as:

$$\Psi = A_{total}\cos(\omega_c t + \Phi) \qquad (\text{Eq. 6})$$

where $$A_{total} = \sqrt{(V_I d_I + \delta_I)^2 + (V_Q d_Q + \delta_Q)^2 + 2(V_I d_I + \delta_I)(V_Q d_Q + \delta_Q)\sin\phi} \qquad (\text{Eq. 6.1})$$

and

-continued $$\Phi = \tan^{-1}\left\{\frac{(V_I d_I + \delta_I)\sin(\phi_c) - (V_Q d_Q + \delta_Q)\cos(\phi_c + \phi)}{(V_I d_I + \delta_I)\cos(\phi_c) + (V_Q d_Q + \delta_Q)\sin(\phi_c + \phi)}\right\}$$ (Eq. 6.2)

To understand how to measure the amplitude error factors $d_I$ and $d_Q$, and also $\delta_I$ and $\delta_Q$, we rewrite Eq. 6.1 as:

$$(V_I d_I + \delta_I)^2 + (V_Q d_Q + \delta_Q)^2 + 2(V_I d_I + \delta_I)(V_Q d_Q + \delta_Q)\sin\phi = A_{total}^2$$ (Eq 7)

Now let $V_I = 0$. Eq. 7 then simplifies to:

$$V_Q^2 D_Q + 2V_Q \Delta_Q + 2V_Q \Psi + \Lambda = A_{total}^2$$ (Eq. 8)

where $$D_Q = d_Q^2$$ (Eq. 8.1)

$$\Delta_Q = d_Q \delta_Q$$ (Eq. 8.2)

$$\Psi = d_Q \delta_I \sin\phi$$ (Eq. 8.3)

$$\Lambda = \delta_I^2 + \delta_Q^2 + 2\delta_I \delta_Q \sin\phi = \delta_I^2 + \delta_Q^2 + 2\frac{(\psi \delta_Q)}{d_Q}$$ (Eq. 8.4)

Note that Eq. 8.4 uses Eq. 8.3 by re-writing it as:

$$\delta_I \sin\phi = \frac{\psi}{d_Q}$$ (Eq. 8.3')

Now it is clear from Eq's 8.1 to 8.5 that under the condition $V_I = 0$ and by applying at least four $V_Q$ values while measuring the corresponding $A_{total}$, a set of linear equations is established that can be solved for the parameters $D_Q$, $\Delta_Q$, $\Psi$ and $\Lambda$. It is straight forward to either solve the linear equations (when we have only used four $V_Q$ values) ore to use any standard linear curve it algorithms (when we have used more than four $V_Q$ values) to solve for $D_Q$, $\Delta_Q$, $\Psi$ and $\Lambda$. Furthermore, the values of $d_Q$, $\delta_Q$, $\delta_I$ and $\phi$ can be calculated directly from Eq's 8.1 to 8.5 as the following:

$$d_Q = \sqrt{D_Q}$$ (Eq. 8.1')

$$\delta_Q = \frac{\Delta_Q}{d_Q}$$ (Eq. 8.2')

$$\delta_I = \pm\sqrt{\Lambda - \delta_Q^2 - 2\frac{(\psi \delta_Q)}{d_Q}}$$ (Eq. 8.4')

$$\phi = \sin^{-1}\left(\frac{\psi}{d_Q \delta_I}\right)$$ (A rearranging of Eq. 8.3')

Now the only thing still unknown is $d_I$, and it can be found by making one more measurement with $V_W = 0$ and an non-zero $V_I$ and applying Eq. 7. But notice the sign ambiguity in solution (8.4'). The ambiguity for $\delta_I$ means we can successfully find only $d_Q$ and $\delta_Q$ from the process above, To resolve the sign ambiguity (and also find $d_I$) more than one measurement needs to be made with $V_Q = 0$. We can essentially repeat what we have done so far for deriving equations (8.1) and (8.4) and equations (8.1') and (8.4'), only this time with $V_Q = 0$. Now all the equations from (8.1) to (8.4) and (8.1') to (8.4') still stand if we replace all I subscripts with Q and replace all Q subscripts with I. By measuring further values for $A_{total}$ at least 4 different non-zero $V_I$ values and applying the same linear equation solving algorithm or linear equation curve fitting algorithm as used to find $d_Q$ and $\delta_Q$, we can now find $d_I$ and $\delta_I$ without any ambiguity. We can also check the quality of our test by comparing the $|\delta_I|$ value found here with the $|\delta_I|$ value derived from (8.4') earlier. Ideally they would be the same, but realistically they should be almost the same, i.e., $|\delta_I|_{V_I=0} \approx |\delta_I|_{V_Q=0}$.

After we get $d_Q$, $\delta_Q$, $d_I$ and $\delta_I$ without any ambiguity, we can solve (8-3') to find the phase imbalance $\phi$ using $d_Q$, $\delta_I$ and $\Psi|_{V_I=0}$ or using $d_I$, $\delta_Q$ and $\Psi|_{V_Q=0}$, or use both sets of data to find $\phi$ twice. This can be used as a check of the result, since in reality the two $\phi$ values should be almost the same.

Once these behavior parameters (i.e., the amplitude errors, DC offsets and the phase imbalance) are measured (that is, found as described above), the control parameters for the IQ modulator can be adjusted in a direction that minimizes the errors represented by the behavior parameters. These error measurements and the IQ modulator adjustment process can be iterated multiple times until the behavior parameters finally get close to ideal, i.e. $d_I = d_Q$, $\delta_I = 0$, $\delta_Q = 0$ and $\phi = 0$.

An FOM (Figure Of Merit) for the behavior parameters might be the sum of the square of the difference between the amplitude error factors plus the square of each DC offset plus the absolute value of the phase imbalance (or its square). This will produce an FOM whose preferred value is zero and that departs rapidly from zero as errors occur. Other rules for an FOM are possible, and in the case where there are more that one control parameter, it may be difficult or impractical to use changes in an FOM to 'steer' the selection of a better combination of control parameters. In such a case it would be advisable to try a range of combinations, and see what FOM result.

Figure 2:
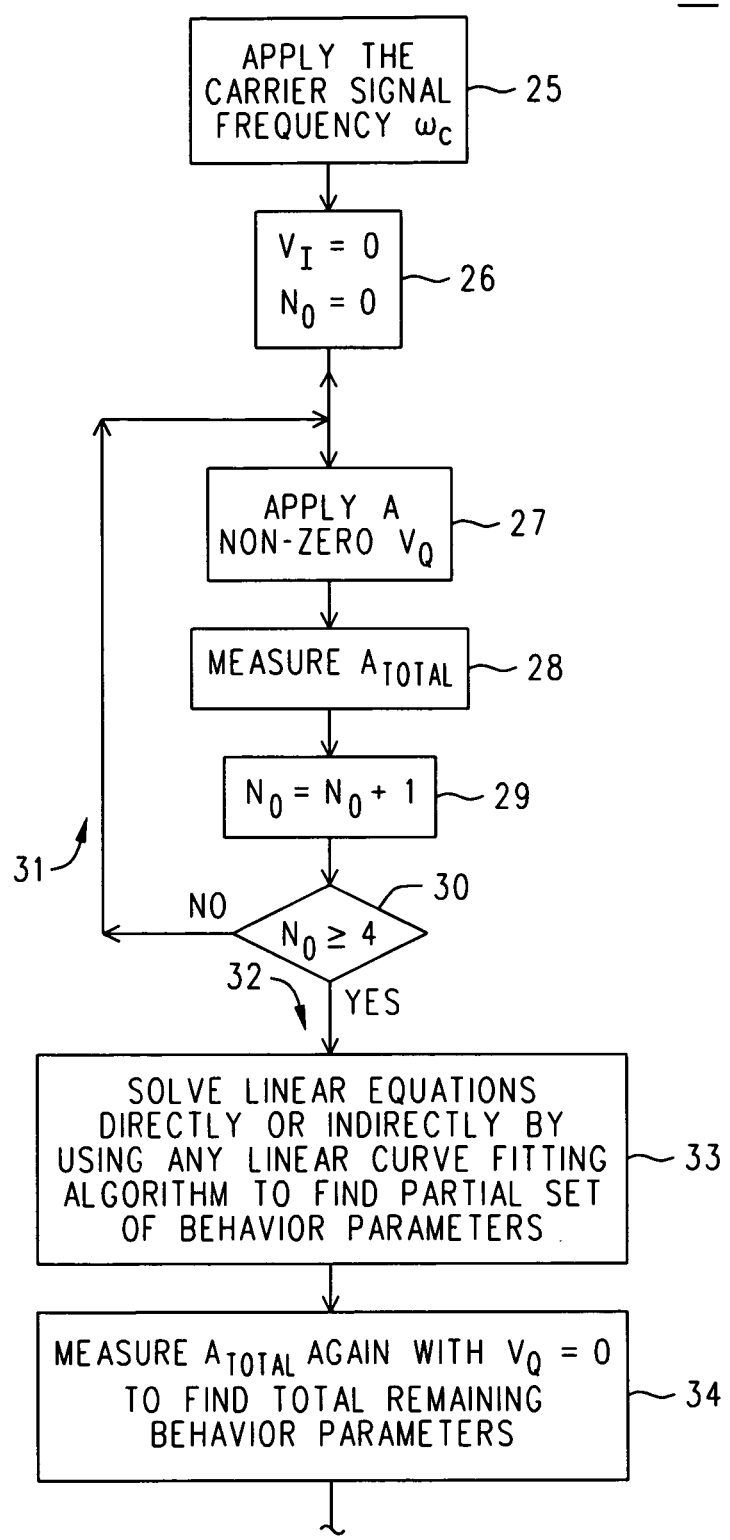
FIG. 2 is a simplified flowchart of the manner of finding various behavior parameters from a repeated modulator output amplitude or power level measurement as the I and Q modulator inputs are placed at various DC bias levels.

Refer now to FIG. 2 wherein is shown a simplified flowchart 24 that describes a generalized flow of control for implementing the discovery of the behavior parameters. (At an outer level of control shown in FIG. 3 some trial or other particular control parameters have already been applied, and we shall see that flowchart 24 is equivalent to step 37 of FIG. 3. At the moment we are not considering how to change the control parameters, only how to find the behavior parameters that exist for whatever control parameters happen to be in use.)

At step 25 the carrier frequency (from 3) is applied to the IQ modulator 2. Then the I and Q modulation inputs (13, 15) are set to zero at step 26, as is an index counter $N_0$ associated with the number of trials. Then at step 27 the Q modulation input is stepped to a non-zero value. At step 28 the value $A_{total}$ is measured (and saved). Than at step 29 the index $N_0$ is incremented for testing at qualifier 30. If $N_0$ is not at least four the answer is 'NO' and the loop returns (31) to step 27 to apply a (different) nonzero Q modulation input value. On the other hand, $N_0$ will eventually reach four (after four times through the loop) and the 'YES' branch (32) from qualifier 30 will lead to step 33, where the partial set of behavior parameters is found (as described above). Then at step 34 the Q modulation input is made zero, some (one or more) measurements are made with different I modulation input values, and the remaining behavior parameters are found or ambiguities removed.

Figure 3:
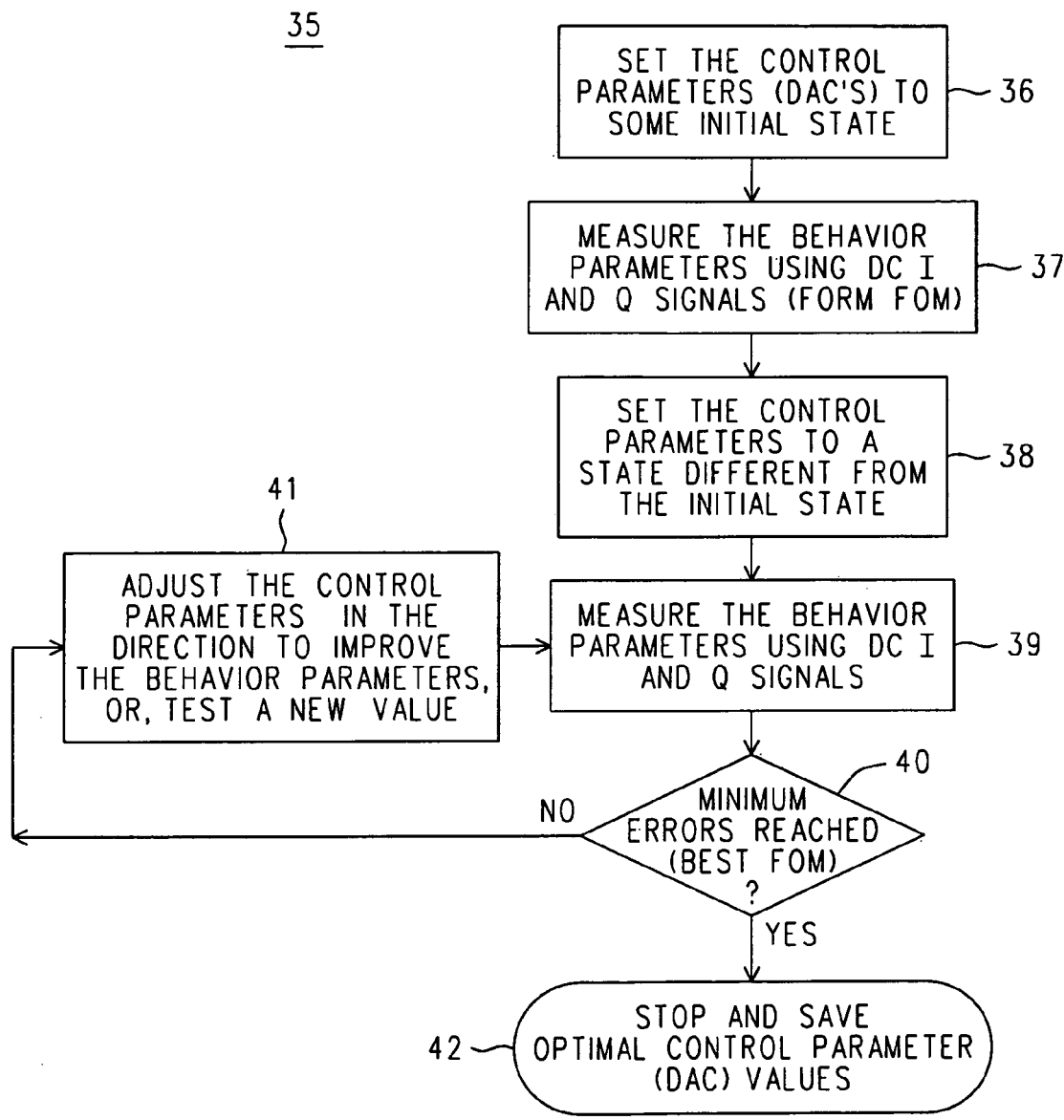
FIG. 3 is a simplified flowchart of the technique described herein for finding an optimum value of one or more control parameters that affect the quality of the IQ modulator's behavior.

Now consider FIG. 3. It is a simplified flowchart 35 that depicts the adjusting of the control parameters as various combinations of behavior parameters are obtained. At step 36 some initial state of the one or more control parameters (18) is established. Then at step 37 (which is FIG. 2) the values of the behavior parameters are found, and also, if desired, an FOM is formed. All this stuff, including the associated values of the control parameters may, if desired, be stored in a table for later inspection. Then at step 38 some different state of the control parameters is established. At step 39 the resulting behavior parameters are measured, again using the techniques of multiple DC input values for the modulation inputs (13, 15). At qualifier 40 a decision is made concerning more trials. The NO branch corresponds to a decision that the best performance has not yet been seen, and a transition is made to step 41 where a new trial value for the control parameters is established. It may be possible (say, there is only one control parameter) to predict from recent trial outcomes which way to adjust for the next trial to get a better FOM. On the other hand, it may be more practical to simply try many possible values (or combinations of values) and select whatever worked best. Either way, step 41 returns to step 39, where the next (and corresponding) batch of behavior parameters is found. Once qualifier 40 decides there has been an optimal batch of behavior parameters or a best FOM a transition is made to step 42, where the process of control parameter evaluation is ended, and the optimal control parameter values are saved as the preferred operating point for that particular IQ modulator 2 under test.

I claim:

1. A method of optimizing the operation of an IQ modulator having at least one control signal, cosine and sine carrier work inputs and respective I and Q modulation inputs, the method comprising the steps of:
   (a) measuring as input parameters the relative amplitudes of, and the phase between, the sine and cosine carriers;
   (b) applying at least one control signal to the IQ modulator that affects its degree of optimal behavior;
   (c) applying to the I modulation input an I input value of zero volts, and then;
      (c1) applying to the Q modulation input at least four Q input values of different selected voltages;
      (c2) measuring a value for the summation of the modulated sine and cosine carriers for each of the different selected voltages of step (c1);
   (d) finding according to a numerical solution a first partial set of behavior parameters associated with steps (c1) and (c2);
   (e) applying to the Q modulation input a Q input value of zero volts, and then;
      (e1) applying to the I modulation input at least four I input values of different selected voltages;
      (e2) measuring a value for the summation of the modulated sine and cosine carriers for each of the different selected voltages of step (e1);
   (f) finding according to a numerical solution a second partial set of behavior parameters;
   (g) combining the first and second partial sets of behavior parameters to produce a complete set of behavior parameters;
   (h) repeating steps (a) through (g) a plurality of times with different values of the at least one control signal of step (b) to obtain a collection of complete sets of behavior parameters, each associated with a different value of the at least one control signal;
   (i) inspecting the collection of step (h) to identify a complete set in the collection that represents optimal operation of the IQ modulator; and
   (j) identifying a respective value of the at least one control signal associated with the complete step of step (i) as producing the optimal operation of the IQ modulator.

2. A method of optimizing the operation of an IQ modulator having at least one control signal, cosine and sine carrier work inputs and respective I and Q modulation inputs, the method comprising the steps of:
   (a) measuring as input parameters the relative amplitudes of, and the phase between, the sine and cosine carriers;
   (b) applying at least one control signal to the IQ modulator that affects its degree of optimal behavior;
   (c) applying to the Q modulation input a Q input value of zero volts, and then;
      (c1) applying to the I modulation input at least four I input values of different selected voltages;
      (c2) measuring a value for the summation of the modulated sine and cosine carriers for each of the different selected voltages of step (c1);
   (d) finding according to a numerical solution a first partial set of behavior parameters associated with steps (c1) and (c2);
   (e) applying to the I modulation input an I input value of zero volts, and then;
      (e1) applying to the Q modulation input at least four Q input values of different selected voltages;
      (e2) measuring a value for the summation of the modulated sine and cosine carriers for each of the different selected voltages of step (e1);
   (f) finding according to a numerical solution a second partial set of behavior parameters;
   (g) combining the first and second partial sets of behavior parameters to produce a complete set of behavior parameters;
   (h) repeating steps (a) through (g) a plurality of times with different values of the at least one control signal of step (b) to obtain a collection of complete sets of behavior parameters, each associated with a different value of the at least one control signal;
   (i) inspecting the collection of step (h) to identify a complete set in the collection that represents optimal operation of the IQ modulator; and
   (j) identifying a respective value of the at least one control signal associated with the complete step of step (i) as producing the optimal operation of the IQ modulator.

* * * * *